(12) United States Patent
Shan

(10) Patent No.: US 7,619,225 B2
(45) Date of Patent: Nov. 17, 2009

(54) MULTIFUNCTION ELECTRON MICROSCOPE SPECIMEN HOLDER

(76) Inventor: Zhiyin Shan, 14 Oval Rd., #55, Irvine, CA (US) 92604

( * ) Notice: Subject to any disclaimer, the term of this patent is extended or adjusted under 35 U.S.C. 154(b) by 389 days.

(21) Appl. No.: 11/710,690

(22) Filed: Feb. 24, 2007

(65) Prior Publication Data
US 2008/0179538 A1     Jul. 31, 2008

(30) Foreign Application Priority Data
Jan. 26, 2007    (CN) .................... 2007 2 0105941 U

(51) Int. Cl.
*H01J 37/20* (2006.01)
(52) U.S. Cl. .................. 250/440.11; 206/557; 206/563; 206/564
(58) Field of Classification Search ................ 250/306, 250/307, 310, 311, 440.11, 441.11, 442.11, 250/443.1; 206/557, 558, 559, 561, 562, 206/563, 564, 560, 565; 850/1, 2, 3; 356/244; 359/397, 398
See application file for complete search history.

(56) References Cited

U.S. PATENT DOCUMENTS

| | | | | |
|---|---|---|---|---|
| 3,768,914 A | * | 10/1973 | Kinney et al. ............. | 356/244 |
| 3,798,423 A | * | 3/1974 | Mindick ..................... | 235/487 |
| 6,518,566 B1 | * | 2/2003 | Brown ........................ | 250/239 |
| 2005/0107917 A1 | * | 5/2005 | Smith et al. ................ | 700/245 |
| 2007/0131873 A1 | * | 6/2007 | Allred et al. ........... | 250/440.11 |

OTHER PUBLICATIONS http://www.tedpella.com/grids_html/gridbox.htm#_161_96.*

\* cited by examiner

*Primary Examiner*—Jack I Berman
*Assistant Examiner*—Nicole Ippolito Rausch
(74) *Attorney, Agent, or Firm*—Clement Cheng

(57) ABSTRACT

A multi-purpose multifunction electron microscope specimen box has a box body, a sliding transparent lid fitting over the box body, and an array of piece holes formed on the top surface of the box body. At least one piece hole has a tweezer trough connected to the at least one piece hole. A material recording card is mounted in sliding connection underneath the box body. The grid hole is diamond shaped and the tweezer trough is rectangular to make a spade shaped hole. The grid hole has a pitch, wherein a trough side is higher than a lower side. The box body top surface has a transparent plastic cover piece that has at least two holes in offset orientation. The grid hole is diamond shaped and the tweezer trough is elliptical to make a spade shaped hole. The multifunction electron microscope specimen box also optionally has a specimen block store cavity and a specimen block store cavity having a symmetrical bulge for storing semi-thin sections.

10 Claims, 3 Drawing Sheets

MULTIFUNCTION ELECTRON MICROSCOPE SPECIMEN HOLDER

This application claims foreign priority from China application number 200720105941.7 filed Jan. 26, 2007 entitled Multipurpose multifunction Specimen Holder to inventor Shan, Zhiyin. This application is a continuation in part of inventor Shan, Zhiyin & Wu, Xiaoshan U.S. patent application Ser. No. 10/985,713 entitled Block and Grid Tray filed Nov. 11, 2004, the disclosure of which is incorporated herein in its entirety by reference.

FIELD OF THE INVENTION

The invention is a kind of multi-purpose multifunction electron microscope specimen box.

DISCUSSION OF RELATED ART

The naked eye cannot observe very small things, but very small things can be enlarged through the electron microscope tens of thousands of times, which is advantageous for experiments or research work. Specimens are small, and recording related information may reduce repetition in observation work, and enhance material use efficiency. The electron microscope specimens are mainly of three kinds: specimen block, half thin slice semi-thin section, and ultra thin slice thin section.

Organization is time-consuming. The cell is soft, the specimen difficult to slice, also, the organization of the cell in the resin is time-consuming. The hard specimen block, also requires a glass cutter which is the diamond knife. Specimen block organization includes slivers half thin or the ultra thin slice thin section. Half thin slice semi-thin section are cut down from the specimen block to thickness of approximately 1-3 micron slices. The ultra thin slice thick is approximately 0.06-0.1 micron.

Electron microscopy is able to magnify small organisms and other materials tens of thousands of times in size. But specimens to be magnified by an electron microscope must be carefully prepared in order to accommodate such use, and to be easily and reliably stored. Such specimens, once prepared, may be viewed dozens or even hundreds of times, and as such the preparation of such specimens is labor intensive and expensive. It is therefore important to carefully store such specimens in such a way as to be easily and reliably identifiable and usable.

Specimen trays and racks for such specimens are well known in the prior art. Within the general field of electron microscopy, there are three primary types of specimens that are used: block, semi-thin section, and thin section. Block specimens are typically soft material that is embedded into a hard resin, marking it easier to slice into semi-thin or thin sections. Semi-thin sections are typically mounted on glass slides for use with optical microscopes, and thin sections are typically grid-mounted for direct observation in an electron microscope.

The electron microscope specimen manufacture needs specialized technology and a long time, making the manufacturing cost higher, but a system for preserving specimens may provide permanent preservation. Therefore, it is important to preserve the complete specimen, in a safe manner, yet allowing fast retrieval when necessary. Present electron microscope specimen general preservation is in specimen boxes. The current electron microscope specimen box has the following shortcomings. First, because the specimen grid is very small, they require tweezers and a user must clamp with the tweezers, if the tweezers clamp the specimen central organization the center of the grid or the membrane the tweezers can damage the organization tissue or puncture the membrane. Secondly, the specimen box and the record material card separates the preservation, and the use inconveniently, and also it is easy to lose the card. Thirdly, net piece "grid is typically very light, and slightly vibrates, therefore, it is very easy to fall outside the net piece grid hole, mixing up the specimens. Fourthly, the net piece grid, the specimen block, half thin slice semi-thin section, the ultra thin slice thin section particularly separated in different dedicated specific specimen box, making combined use inconvenient.

BRIEF DESCRIPTION OF THE INVENTION

Figure 1:
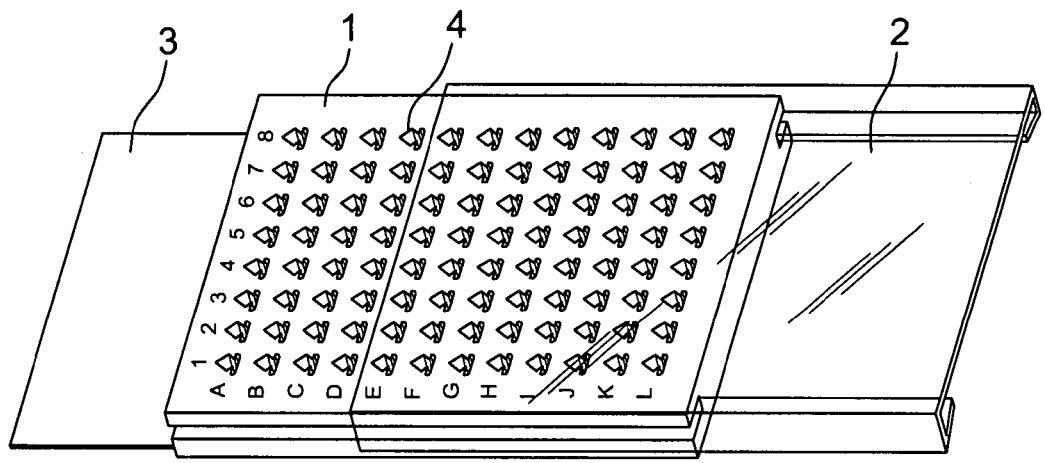
FIG. 1 is a diagram showing the utility of the structure in a schematic drawing.

The invention is one kind of multi-purpose multifunction electron microscope specimen box. Specimens and information depositing remain in the same place, also the clamp usage does not damage the specimen. The specimen holder makes it difficult for the specimen to fall out, and the device can be operated single-handedly. To solve the above technical hurdles this technical plan comprises: the specimen box, including the box body with the box body peg grafting transparent lid, the box body specimen piece hole, and nearby the specimen piece hole is placed the trough, this and the grid hole connects.

The multi-purpose multifunction electron microscope specimen box, the net piece grid hole assumes a diamond shape profile, the trough assumes a rectangle or ellipse providing a tweezer hole for the removal of the specimen. The multi-purpose multifunction electron microscope specimen box, net piece grid has a pitched shape profile with that has the trough side to be slightly higher. The material recording card for the multi-purpose multifunction electron microscope specimen box is stored underneath the box body. The multi-purpose multifunction electron microscope specimen box, the box body surface and guide cover is an inserted transparent plastic piece, this plastic piece is equipped with one or more holes. In the multi-purpose multifunction electron microscope specimen box, the plastic piece is equipped with at least two to open the hole, for access to the specimen. The plastic guide cover piece allows opening to the hole to be located by the user in multiple locations on one side of the box, or on the other. The box body also establishes a specimen block store cavity. The specimen block store tank is preferably established with a symmetrical bulge, so that a half thin slice semi-thin section may insert in the trough for preservation and storage.

The multi-purpose multifunction electron microscope specimen box has the following meritorious features. First, the tweezers slot and the net sample piece grid hole connect, so that a user can clamp with the tweezers when taking the net sample piece specimen. Also, the tweezers insertion slot grips the net piece grid edge, unlike the current specimen storage boxes that make it easy to damage the organization tissue or the membrane. Secondly, the material inventory recording card the slot, the condition which the change existing card and the box body separates. The specimen material card is now harder to lose or confuse since it slides under the box. Thirdly, in the existing technology, the net piece grid is easy to fall out of the specimen box the net piece grid hole, but this is practical new invention additionally has a transparent plastic sliding cover allowing selective plastic piece hole opening which allows opening to a selected hole size which allows removal of the net piece grid with an adapted net piece grid hole. If the device is dropped on the ground with the plastic piece does not allow all of the contents to fall out, unless the plastic cover piece openings are lined with the hole openings underneath. Fourthly, this practical new specimen box also establishes the specimen block store cavity, the net piece grid and specimen block storage in a single specimen box, solving the inconvenience of having to search for specimens for the same project in different containers.

DETAILED DESCRIPTION OF THE PREFERRED EMBODIMENT

In the graphical representations and drawings though: a list of elements is as follows: box body 1, lid 2, card 3, net piece grid holes 4, lid slot 5, card slot 6, tweezers slot 7, net piece grid 8, tweezers 9, pitch 10, plastic piece 11, open hole 12, specimen block store cavity 13, bulge 14, half thin slice semi-thin section 15, half thin slice semi-thin section slot 16.

The following is a concrete implementation and method that correlates the figures to the operation of the preferred embodiment which is an example of the operation of the invention. In the first embodiment or implementation example one: the FIGS. 1, 2, 3, 4, 5 show, the electron microscope specimen box including the box body 1, the transparent lid 2, the material recording card 3, the transparent plastic piece 11, the box body 1. The two sides respectively are equipped with a lid slot 5, lid 22. Knee bends and the knee bend nose insertion lid slot 5, thus causes the box body 1 and lid 2 peg sliding together as seen in FIG. 2. The box body 1 area above the openings have a network of markings to indicate addresses for remembering location of pieces of samples. The net piece grid hole 4, it is crosswise oriented to the opening 12, longitudinally disposed over the piece grid 8 in even distributions. The hole 4 assumes the diamond shape, a hole 4 connects a rectangular tweezers slot 7 forming a spade shape; and grasping tweezers 9 set in hole 4 to retrieve nets piece grid 8.

The tweezers 9 enters slot 7, so that the tweezers grab on both sides of the net piece grid 8 edge partially, but not directly grabbing on both sides of the net piece grid middle, so as not damaging the sample located the organization or the membrane middle. The hole 4 bases have a pitch 10, and the pitch 10 depends on a slot 7 side slightly high, where another side is low to roll the sample into a lower automatically oriented position. When the net piece grid 8 sets to the hole 4, the net piece grid 8 position automatically orients to the tweezer slot 7 and thus, guarantees that when tweezers 9 clamps to take the net piece grid 8, it grips the net piece grid 8 edges but does not damage the specimen. The box body 1 has underneath and inside a place equipped with card slots 6, so that the card 3 inserts into two side card slots 6, causing card 3 to store together with the box body, preventing card 3 loss which facilitates overall efficiency allowing card examination contemporaneous to the related specimen material. The transparent plastic cover piece 11 is located in sliding connection to the box body 1 with lid 2. The plastic piece 11 opens and has at least two openings 12, so that the openings of the hole 12 sizes adapt with four net pieces grid hole 4 sizes. The pair of openings to the hole 12 are preferably offset so that when a first opening 12 accessing four holes 4 is aligned to allow access by tweezer, the second opening 12 is offset preferably by half a phase to prevent loss of all samples if the box is dropped on the ground. The offset thus becomes an extra safety device to reduce the number of lost samples in case of handling accident because half a phase offset misalignment is enough to retain the sample in case of an accident.

When tweezers take the net piece grid 8, the user moves lid 2 and moves the plastic cover piece 11, which causes the plastic piece 11 opens hole 12 to get alignment. The user then takes the grid out of the grid hole 4.

The grid hole do not have to tweezer which takes the grid institute 4 by the plastic piece 11 and the lid 2 covers, the grid 8 cannot be separated from the grid hole 4 but to combine in the same place.

Figure 2:
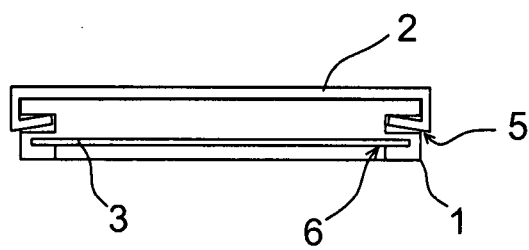
FIG. 2 is the specimen box front side view.
Figure 3:
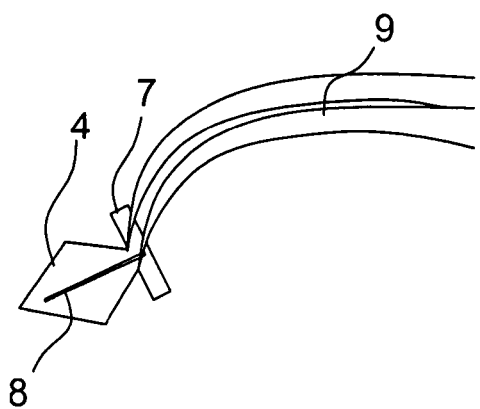
FIG. 3 is the net piece grid hole enlarged drawing.
Figure 4:
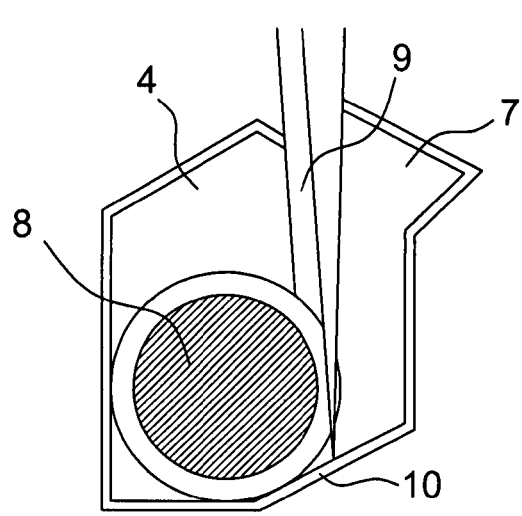
FIG. 4 is the net piece grid placement figure.
Figure 5:
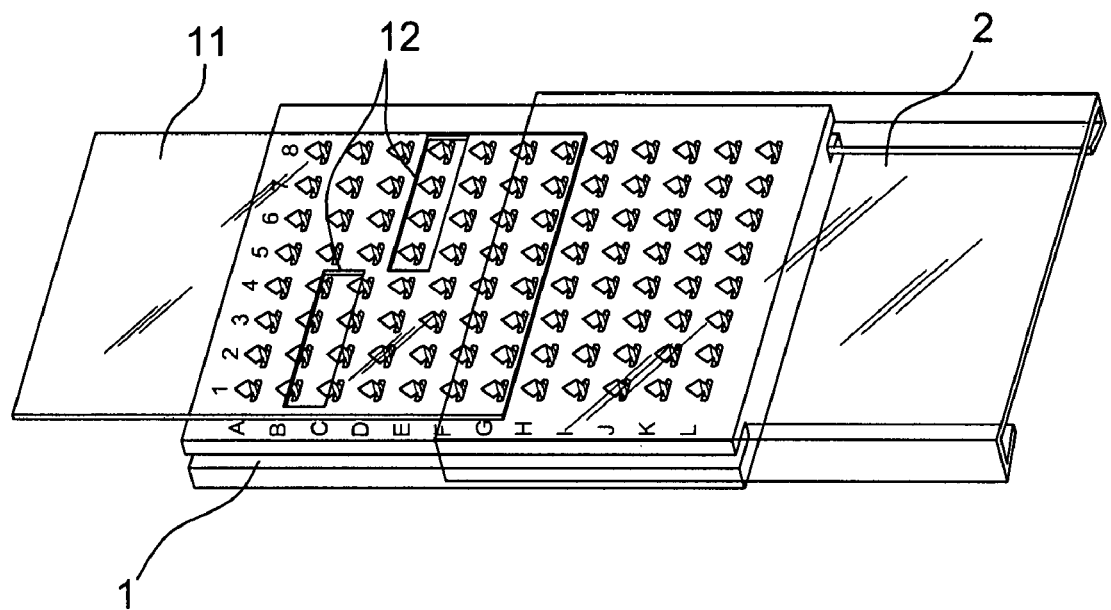
FIG. 5 is the plastic cover piece use state diagram.
Figure 6:
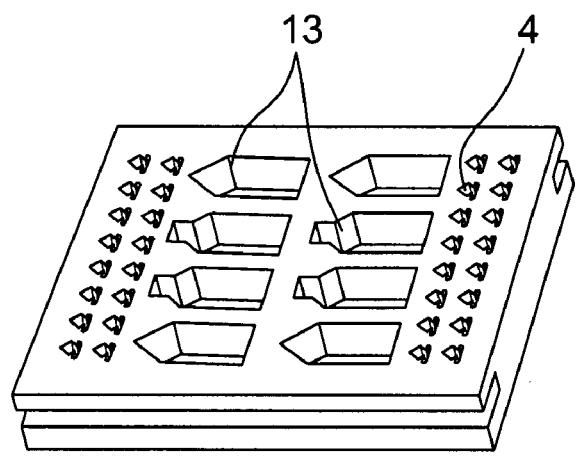
FIG. 6 is this practical new implementation example two structures schematic drawings.
Figure 7:
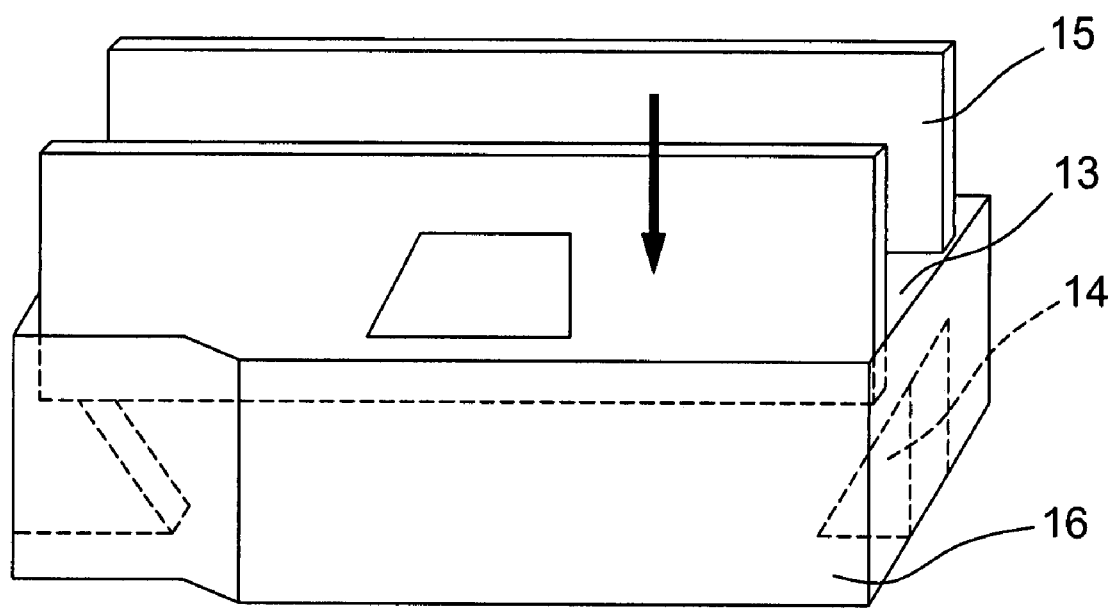
FIG. 7 is the specimen block store tank chart.

In the second embodiment, the box is similar to that shown in FIG. 1 but is modified as seen in FIG. 6, 7. The box body 1 in the second embodiment has an established array of piece holes 4, and also is equipped with 8 specimens blocks store cavity 13, that are capable of receiving the specimen block in the store cavity 13 for storage. The store cavity 13 base has an established preferably symmetrical bulge 14, the bulge on two sides form the trough for receiving a flat object which is the semi-thin section 15. Vertical insertions against the bulge on the two sides of the troughs preserves, and facilitates specimen preservation and easy retrieval and use. This second embodiment and the first embodiment are otherwise the same.

Figure 8:
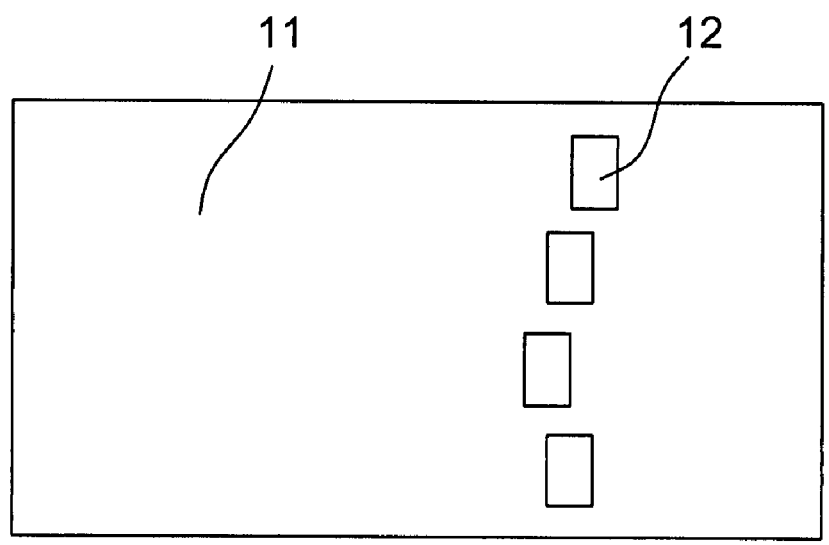
FIG. 8 is the implementation example three plastics pieces structure schematic drawing.

In a third embodiment, FIG. 8 shows, the plastic cover piece 111 equipped with four open holes 12 that are all offset from each other by a quarter phase which is 25% of the distance between two rows of sample holes. In the third embodiment, the other contents implementations are basically the same.

The invention claimed is:
1. A multifunction electron microscope specimen box comprising:
  a. a box body;
  b. a transparent lid fitting over the box body in a sliding fit over the box body;
  c. a transparent plastic cover piece slidingly fit between the sliding transparent lid and the box body;
  d. two holes in offset orientation disposed on the transparent plastic cover piece;
  e. an array of piece holes formed on the top surface of the box body, wherein the wherein the grid hole is diamond shaped; and
  f. tweezer troughs formed on at least some of the piece holes of the array of piece hole, wherein the tweezer troughs are connected to the at least some of the piece holes, wherein the tweezer trough is elliptical or rectangular, wherein the tweezer trough is perpendicularly arranged with respect to the grid hole, wherein the tweezer trough is located at an end of the grid hole.

2. The multifunction electron microscope specimen box of claim 1 further comprising a material recording card mounted in sliding connection underneath the box body.

3. The multifunction electron microscope specimen box of claim 1, further comprising a specimen block store cavity.

4. The multifunction electron microscope specimen box of claim 1, further comprising a specimen block store cavity having a symmetrical shape for storing flat specimens.

5. The multifunction electron microscope specimen box of claim 1, wherein the array of piece holes each have a pitch, wherein a trough side is higher than a lower side.

6. The multifunction electron microscope specimen box of claim 1, wherein the offset is half a phase between rows of the array of piece holes.

7. The multifunction electron microscope specimen box of claim 6 further comprising a material recording card mounted in sliding connection underneath the box body.

8. The multifunction electron microscope specimen box of claim 6, further comprising a specimen block store cavity.

9. The multifunction electron microscope specimen box of claim 6, further comprising a specimen block store cavity having a symmetrical shape for storing flat specimens.

10. The multifunction electron microscope specimen box of claim 6, wherein the array of piece holes each have a pitch, wherein a trough side is higher than a lower side.

\* \* \* \* \*